(12) United States Patent
Colbeck

(10) Patent No.: US 7,365,559 B2
(45) Date of Patent: Apr. 29, 2008

(54) CURRENT SENSING FOR POWER MOSFETS

(75) Inventor: Roger Colbeck, Stittsville (CA)

(73) Assignee: Potentia Semiconductor Inc., Wilmington, DE (US)

( * ) Notice: Subject to any disclaimer, the term of this patent is extended or adjusted under 35 U.S.C. 154(b) by 92 days.

(21) Appl. No.: 11/119,699

(22) Filed: May 3, 2005

(65) Prior Publication Data

US 2006/0250153 A1 Nov. 9, 2006

(51) Int. Cl.
*G01R 31/26* (2006.01)
(52) U.S. Cl. ........................ 324/769; 340/635
(58) Field of Classification Search ............... None
See application file for complete search history.

(56) References Cited

U.S. PATENT DOCUMENTS

| | | | | |
|---|---|---|---|---|
| 4,952,827 | A * | 8/1990 | Leipold et al. | 327/434 |
| 5,656,968 | A * | 8/1997 | Sander et al. | 327/543 |
| 6,049,213 | A * | 4/2000 | Abadeer | 324/719 |
| 6,507,227 | B2 * | 1/2003 | Genova et al. | 327/109 |
| 6,897,717 | B1 * | 5/2005 | Eddleman et al. | 327/543 |
| 6,995,555 | B2 * | 2/2006 | Graf | 324/126 |
| 6,998,899 | B2 * | 2/2006 | Nadd et al. | 327/513 |
| 7,005,881 | B2 * | 2/2006 | Thiery | 324/768 |
| 7,113,019 | B2 * | 9/2006 | Nadd et al. | 327/512 |

OTHER PUBLICATIONS

"Current Sensing Power MOSFETs"; ON Semiconductor; Jul. 2002—Rev.5.
"SMART HotPlug Current Limit Function"; ON Semiconductor; Nov. 2004—Rev. 1.
"Current Sensing Power MOSFETs"; Philips; Rev.01.00-09 Sep. 2004.
"SMART Hotplug IC/Inrush Limiter/Circuit Breaker"; ON Semiconductor; Feb. 2005—Rev. 15.

* cited by examiner

*Primary Examiner*—Ha Tran Nguyen
*Assistant Examiner*—Richard Isla-Rodas

(57) ABSTRACT

A power MOSFET, comprising main and current mirror MOSFETs, has a current sense resistance coupled between its mirror and source terminals and a monitoring circuit responsive to a first voltage dependent upon current through the current sense resistance. The circuit arrangement includes a circuit that determines a second voltage, different from the first voltage, of a terminal of the current mirror MOSFET, and a circuit arranged to determine current of the power MOSFET in dependence upon the first and second voltages. The second voltage can be the voltage at the drain terminal, or the voltage at the mirror terminal with switching of the current sense resistance or a current that it passes. It can alternatively be determined by a control circuit to be a desired fraction of the drain voltage.

19 Claims, 2 Drawing Sheets

CURRENT SENSING FOR POWER MOSFETS

This invention relates to current sensing for power MOSFETs, and is particularly concerned with facilitating accurate current measurement for a current sensing MOSFET without requiring use of a virtual ground circuit.

BACKGROUND

A power MOSFET typically comprises a large number of MOSFET transistor cells all connected in parallel with one another, i.e. with their gates connected together, their drains connected together, and their sources connected together. In order to facilitate sensing a load current of a power MOSFET when it is conductive or switched on, without requiring a series resistor to pass all of the load current and hence have a significant and undesired power dissipation, it is known to provide a current sensing MOSFET in which a relatively small number of the transistor cells (referred to as the current mirror section) of the MOSFET have a separate source terminal, referred to as a mirror or sense terminal. A current sensing resistor can be connected between the mirror and source terminals to pass only a predetermined small fraction of the total load current, so that power dissipation in the current sensing resistor is relatively small.

ON Semiconductor application notes AND8093/D entitled "Current Sensing Power MOSFETs", July 2002 and AND8140/D entitled "SMART HotPlug™ Current Limit Function", November 2004 describe some aspects of current sensing power MOSFETs, and refer to such a MOSFET as a SenseFET™. ON Semiconductor publication NIS5101/D, entitled "SMART HotPlug™ IC/Inrush Limiter/Circuit Breaker", February 2005 describes an integrated circuit that combines a current sensing MOSFET with a control circuit. Philips Semiconductors application note AN10322_1 entitled "Current Sensing Power MOSFETs", September 2004, also describes aspects of current sensing power MOSFETs.

The AND8093/D and AN10322_1 references describe using a virtual ground sensing circuit, which enables the gate-source voltages of the current mirror and main sections of the MOSFET to be equal so that accurate current sensing can be achieved. However, virtual ground current sensing has the significant disadvantages of requiring a relatively negative power supply and producing a relatively negative output voltage.

These references also describe the simpler technique of sense resistor current sensing, which does not require a negative power supply. As described in AND8093/D, it is desirable for the resistance of the sense resistor to be less than about 10% of the on-resistance of the current mirror section of the MOSFET, so that the sensed current is approximately equal to the load current divided by the current mirror ratio of the MOSFET. In practice, larger values of resistance may be needed to provide sufficient voltage drop for accurate sensing. As a larger resistance value appreciably increases the total resistance in the current mirror path, it makes the gate-source voltage of the current mirror section different from that of the main section of the MOSFET, leading to inaccurate current sensing.

This can be allowed for using equations provided in AND8093/D using the typical connection arrangement shown in FIG. 2 of that publication or in FIG. 1 of AND8140/D. However, such equations rely on resistance parameters of the MOSFET that may not be accurately known and that may vary with temperature. Consequently, a load current determined in this manner may not meet a desired accuracy. In addition, it may be desired to monitor the sensed voltage drop, for example supplying it to an analog-to-digital converter (ADC) to provide a digital value. In this case, an inconvenient and undesirable correction may be required at the output of the ADC.

There is therefore a need to provide improved current sensing arrangements for use with current sensing MOSFETs.

SUMMARY OF THE INVENTION

One aspect of this invention provides a method of monitoring current of a MOSFET having gate, drain, source, and mirror terminals, the MOSFET comprising a main MOSFET coupled to the gate, drain, and source terminals and a current mirror MOSFET coupled to the gate, drain, and mirror terminals, the method comprising the steps of: coupling a current sense resistance to the mirror terminal; monitoring a first voltage dependent upon current through the current sense resistance; determining a second voltage, different from the first voltage, of a terminal of the current mirror MOSFET; and determining current of the MOSFET in dependence upon the first and second voltages.

The step of determining the second voltage can comprise monitoring the voltage at the drain terminal, monitoring the voltage at the mirror terminal under different conditions from those for the first voltage, or providing a circuit for controlling the voltage of the mirror terminal to have a determined value or relationship to the voltage at the drain terminal. The different conditions can comprise different values of sense resistance and/or different currents passed by the sense resistance.

In one form of the method the first and second voltages comprise monitored voltages of the mirror and drain terminals respectively; in this case for example the first and second voltages can be monitored alternately.

In another form of the method the step of determining the second voltage comprises changing the current sense resistance to produce the first and second voltages at the mirror terminal with different values of current sense resistance. For example, the second voltage can be produced by switching the mirror terminal to a substantially open circuit, whereby the second voltage at the mirror terminal is approximately equal to a voltage at the drain terminal.

In a further form of the method the step of determining the second voltage comprises switching current to or from the current sense resistance to produce the first and second voltages at the mirror terminal with different values of current through the current sense resistance.

In another form of the method the current sense resistance is coupled to the mirror terminal via a controllable resistance, the first voltage is a voltage at a junction between the current sense resistance and the controllable resistance, and the second voltage is a voltage at the mirror terminal determined by a control circuit controlling the controllable resistance to maintain the second voltage as a constant fraction of a voltage at the drain terminal. For example the second voltage at the mirror terminal can be determined by the control circuit to be half the voltage at the drain terminal.

Embodiments of the method of the invention can include the step of converting the first and second voltages to digital values, the step of determining current of the MOSFET comprising determining the current digitally from the digital values.

Another aspect of the invention provides a circuit arrangement for monitoring current of a MOSFET having gate, drain, source, and mirror terminals, the MOSFET comprising a main MOSFET coupled to the gate, drain, and source terminals and a current mirror MOSFET coupled to the gate, drain, and mirror terminals, comprising: a current sense resistance coupled between the mirror terminal and a connection to the source terminal; a monitoring circuit responsive to a first voltage dependent upon current through the current sense resistance; a circuit for determining a second voltage, different from the first voltage, of a terminal of the current mirror MOSFET; and a circuit arranged to determine current of the MOSFET in dependence upon the first and second voltages.

The circuit arranged to determine current of the MOSFET can comprise an ADC (analog-to-digital converter) responsive to at least the first voltage and digital logic responsive to an output of the ADC.

The circuit arrangement can include a selector for alternately selecting voltages of the mirror and drain terminals as the first and second voltages respectively, or a switch arranged to change the current sense resistance to produce the first and second voltages at the mirror terminal with different values of current sense resistance. In the latter case one state of the switch can be a substantially open circuit of the mirror terminal, whereby the second voltage at the mirror terminal is approximately equal to a voltage at the drain terminal.

Alternatively, the circuit arrangement can include a switched current source or sink arranged to switch current to or from the current sense resistance to produce the first and second voltages at the mirror terminal with different values of current through the current sense resistance.

As a further alternative, the circuit for determining the second voltage can comprise a controllable resistance, via which the current sense resistance is coupled to the mirror terminal, and a control circuit responsive to a voltage at the drain terminal to control the controllable resistance to maintain a voltage at the mirror terminal as a constant fraction of the voltage at the drain terminal, the first voltage being constituted by a voltage at a junction between the current sense resistance and the controllable resistance and the second voltage being constituted by the voltage at the mirror terminal. For example the control circuit can comprise an amplifier having differential inputs coupled to the mirror terminal and to a tapping point of a potential divider between the drain and source terminals.

The circuit arranged to determine current of the MOSFET conveniently includes an amplifier for amplifying at least the first voltage.

An aspect of the invention provides a circuit comprising: a current-sensing MOSFET having gate, drain, source, and mirror terminals; a current sense resistor coupled between the mirror terminal and a connection to the source terminal; at least one ADC (analog-to-digital converter) arranged to produce digital values representing voltages of the mirror and drain terminals; and digital logic responsive to the digital values to monitor current of the MOSFET.

Another aspect of the invention provides a circuit comprising: a current-sensing MOSFET having gate, drain, source, and mirror terminals; a current sense resistor coupled between the mirror terminal and a connection to the source terminal; a control device for selectively changing current through the current sensing resistor to produce first and second voltages selectively at the mirror terminal; an ADC (analog-to-digital converter) arranged to produce digital values representing the first and second voltages; and digital logic responsive to the digital values to monitor current of the MOSFET. The control device can comprise a switch for selectively changing a resistance of the current sense resistor, or a controlled current source or sink coupled to the current sense resistor.

A further aspect of the invention provides a circuit comprising: a current-sensing MOSFET having gate, drain, source, and mirror terminals; a controllable resistance and a current sense resistor coupled in series between the mirror terminal and a connection to the source terminal; and a control circuit arranged to control the controllable resistance to provide at the mirror terminal a voltage that is a constant fraction of a voltage at the drain terminal, whereby a voltage at a junction between the controllable resistance and the current sense resistor represents current of the MOSFET.

BRIEF DESCRIPTION OF THE DRAWINGS

The invention will be further understood from the following description by way of example with reference to the accompanying drawings, in which the same references are used in different figures to denote similar elements and in which.

DETAILED DESCRIPTION

Figure 1:
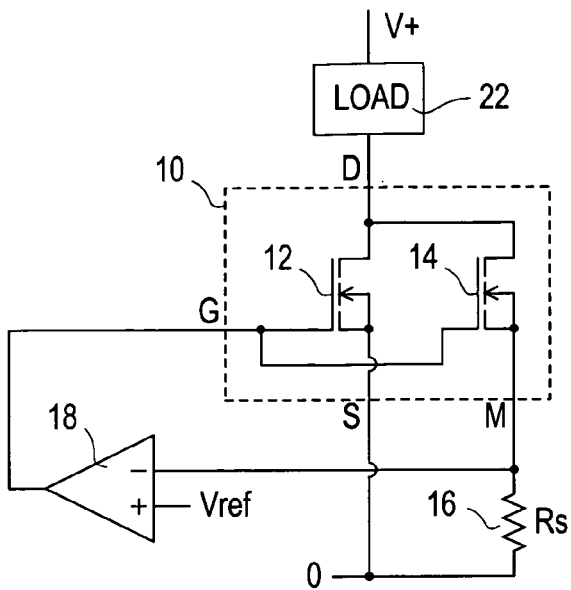
FIG. 1 schematically illustrates a known circuit including a current sensing power MOSFET.

Referring to the drawings, FIG. 1 illustrates a known circuit including a current sensing power MOSFET 10, indicated within a dashed-line box, which comprises a main MOSFET 12 and a current mirror or current sensing MOSFET 14. The MOSFETs 12 and 14 have their gates connected together and to a common gate terminal G, and their drains connected together and to a common drain terminal D. The source of the main MOSFET 12 is connected to a source terminal S, and the source of the current mirror MOSFET 14 is connected to a mirror terminal M. There is a predetermined ratio k of transistor cells of the MOSFET 12 to transistor cells of the MOSFET 14; for example k may be of the order of 100 to 1000.

Because all of the transistor cells of an individual power MOSFET 10 are similar, if the gate-source voltage Vgs and the gate-mirror voltage Vgm are equal, then substantially (ignoring effects due for example to bulk resistance of MOSFET conductors) the MOSFETs 12 and 14 pass currents in the ratio k:1 and have resistances in the ratio 1:k.

In the circuit of FIG. 1, the source terminal S is connected to a zero-volt line, and the mirror terminal M is connected via a current sense resistor 16, having a resistance Rs, to the zero-volt line. An operational amplifier 18 has differential inputs supplied with a voltage dropped across the resistor 16 and a reference voltage Vref, and produces at its output a control signal that is supplied to the gate terminal G of the power MOSFET 10. A load 22 is connected between a positive supply voltage V+ and the drain terminal D. The feedback arrangement provided by the amplifier 18 acts to control the MOSFET gate voltage to limit the MOSFET drain current which is also the load current.

In a typical application of the power MOSFET 10, it may be desired to monitor the load current accurately and continuously; for example the load 22 may be constituted by one or more power converters having low voltage outputs, for which monitoring of the load current can provide an indication of proper or faulty operation. To this end, it may be desirable to monitor the voltage dropped across the current sense resistor 16, for example supplying this as an input to an analog-to-digital converter (not shown) to produce a digital value representing the load current.

As explained above, the resistance Rs of the current sense resistor 16 should be small compared with the on-resistance of the current mirror MOSFET 14 so that the voltage Vgm is substantially the same as the voltage Vgs, but this resistance Rs must be large enough to provide a sufficient sensed voltage to the amplifier 18 and for monitoring. Equation 3 of AN8093/D referred to above allows the load current to be determined from the sensed voltage, the known value of the resistance Rs, and resistance parameter values of the MOSFETs 12 and 14. However, such parameter values (and other parasitic resistances that may affect the calculation) are not accurately known, and also may vary with temperature.

Figure 2:
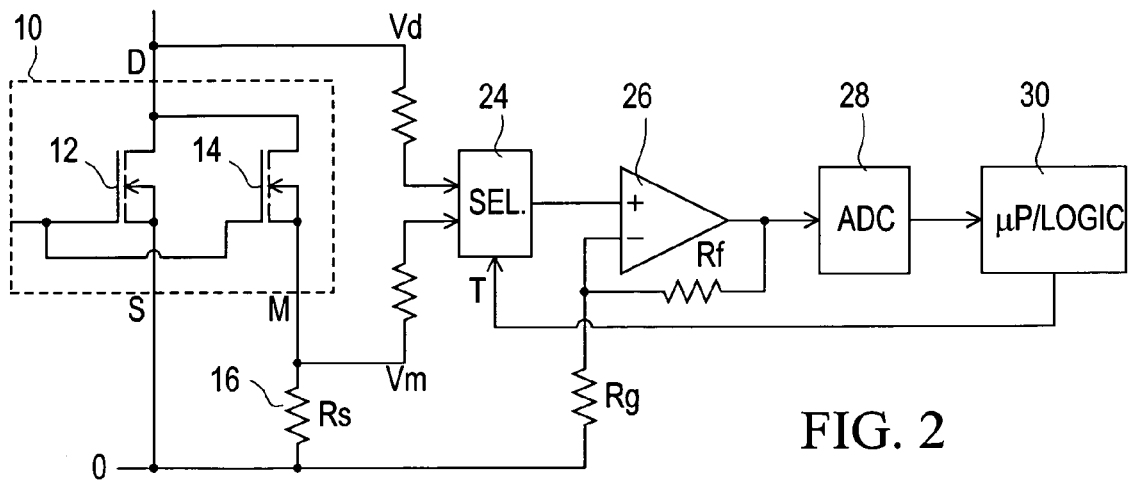
FIG. 2 schematically illustrates a current sensing circuit in accordance with one embodiment of the invention.

FIG. 2 illustrates a circuit in accordance with one embodiment of the invention, in which a voltage Vd of the drain terminal D is sensed in addition to a voltage Vm of the mirror terminal M. In the circuit of FIG. 2, the current sense resistor 16 is connected between the mirror terminal M and the source terminal S, which is connected to a zero-volt line, in a similar manner to that of FIG. 1. The voltages Vm and Vd, at the mirror and drain terminals respectively, are coupled via respective protection resistors and a selector 24, controlled by a toggle signal T, to a non-inverting input of an amplifier 26 which amplifies the respective voltage with a gain $A=1+(Rf/Rg)$, where as shown in FIG. 2 Rf is the resistance of a feedback resistor between the output and inverting input of the amplifier and Rg is the resistance of a resistor between the inverting input of the amplifier and the zero-volt line. The output of the amplifier is converted into a digital value by an ADC 28, the resulting digital values, corresponding alternately to the voltages Vm and Vd, being supplied to a microprocessor or digital logic 30 which produces the toggle signal T.

Denoting the total load current passed by the power MOSFET 10 as I, drain-source currents passed by the MOSFETs 12 and 14 as I1 and I2 respectively, and on-resistances of the MOSFETs 12 and 14 as Ra and Rb respectively so that $Rb=k \cdot Ra$, it can be seen that:

$$I2=Vm/Rs=(Vd-Vm)/(k \cdot Ra)$$

from which $$Ra=Rs(Vd-Vm)/(k \cdot Vm);$$

and that $$I=I1+I2=(Vd/Ra)+(Vm/Rs),$$

so that $$I=(k \cdot Vd \cdot Vm/(Rs(Vd-Vm))+(Vm/Rs).$$

For a large value of k and I1>>I2, this gives:

$$I=(k/Rs) \cdot Vd \cdot Vm/(Vd-Vm) \quad (1).$$

The digital values produced by the ADC 28 in the circuit of FIG. 2 represent the voltages Vd and Vm, and k and Rs are known, so that the current I can easily be determined from these values in accordance with equation (1) by the microprocessor 30.

It can be appreciated that in the circuit of FIG. 2 the amplifier 26 is optional and can be omitted. It is assumed in the circuit of FIG. 2 that the load current I does not change rapidly so that the alternating selection of the voltages Vd and Vm for conversion by the ADC 28 does not introduce errors; alternatively, separate ADCs can be provided for simultaneous measurement of the voltages Vd and Vm, and the selector 24 can be omitted. Digital logic circuitry can be provided instead of the microprocessor 30, or an analog circuit can be used to produce an analog signal representing the current I in accordance with equation (1) without any ADC.

It can be seen that the value of Vd/(Vd−Vm) used in equation (1) is equal to the ratio (Rb+Rs)/Rb and is substantially independent of current. Accordingly, this value Vd/(Vd−Vm) can be determined only once, or only occasionally at a relatively slow rate, from measured values of Vm and Vd to provide a calibration factor which is subsequently multiplied by the measured voltage Vm to determine the load current I in accordance with equation (1). Alternatively, the voltages Vm and Vd can be monitored in a continuing manner to take into account variations for example with temperature.

The circuit of FIG. 2 can be used directly in an integrated circuit, such as that described in NIS5101/D referred to above, that combines a current sensing MOSFET with a control circuit, because the circuit of FIG. 2 does not change the operating conditions of (e.g. the current through) the sense resistor 16. It will be appreciated that the circuit of FIG. 2, and each of the other circuits described below, is only intended to monitor the load current during steady state conditions, when the MOSFET is conductive and its drain voltage Vd is small, and not for example during inrush current conditions.

In the circuit of FIG. 2, the drain voltage Vd is measured directly as described above. Alternatively, the drain voltage Vd can be determined indirectly, for example as in the current sensing circuit illustrated in FIG. 3.

Figure 3:
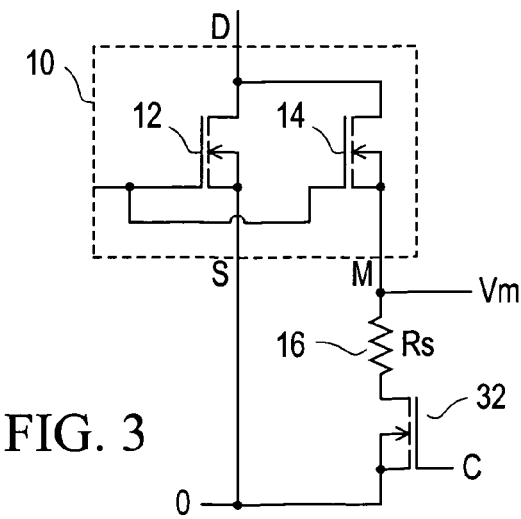
FIG. 3 schematically illustrates a current sensing circuit in accordance with another embodiment of the invention.

FIG. 3 shows the power MOSFET 10 having its source terminal S connected to the zero-volt line and its mirror terminal M, the voltage Vm of which is monitored for example via an ADC and microprocessor (not shown in FIG. 3) as described above with reference to FIG. 2, connected to the zero-volt line via the current sense resistor 16 in series with the drain-source path of a MOSFET 32. The MOSFET 32 is switched on and off by a control signal C applied to its gate.

When switched on by the control signal C, the MOSFET 32 has a drain-source resistance that is negligible compared with the resistance Rs of the sense resistor 16, so that the monitored voltage Vm is the same as described above with reference to FIG. 2. When switched off by the control signal C, the MOSFET 32 has a very high resistance, effectively an open circuit, so that the voltage at the mirror terminal M, here referred to as Vm', rises to substantially the drain voltage Vd.

Consequently, with the circuit of FIG. 3, equation (1) can be used in the same manner as described above to determine the load current I, by substituting the monitored voltage Vm' for the drain voltage Vd. However, because the switching of the MOSFET 32 by the control signal C changes the operating conditions for the sense resistor 16, the circuit of FIG. 3 may not be usable directly with the NIS5101/D integrated circuit referred to above.

Figure 4:
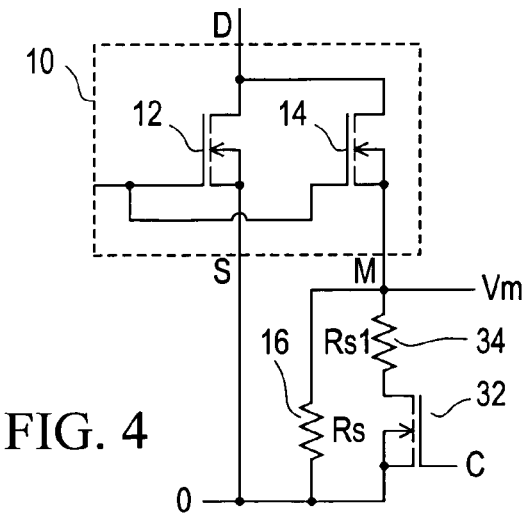
FIG. 4 schematically illustrates a modified form of the current sensing circuit of FIG. 3, in accordance with another embodiment of the invention.
Figure 5:
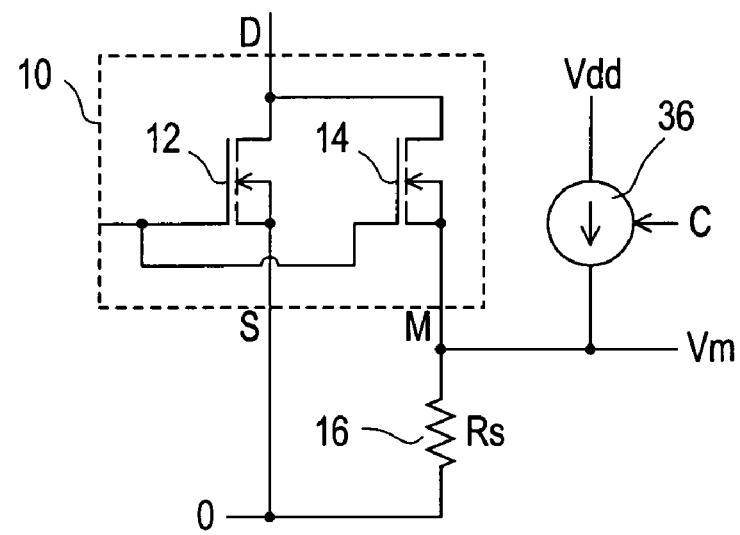
FIG. 5 schematically illustrates a current sensing circuit in accordance with a further embodiment of the invention.

Instead of switching between the resistance Rs and an effective open circuit as in the circuit of FIG. 3, the MOSFET 32 can be arranged to switch between two different values of resistance between the mirror terminal M and the zero-volt line. For example, FIG. 4 shows a circuit in which the MOSFET 32, controlled by the control signal C, selectively connects a resistor 34 having a resistance Rs1 in parallel with the sense resistor 16 of resistance Rs. Other switched resistor arrangements, providing resistances in series and/or in parallel, can alternatively be provided.

In the circuit of FIG. 4, with the MOSFET 32 switched off the effective sense resistance is Rs and the monitored voltage at the mirror terminal is denoted Vm. With the MOSFET 32 switched on, denoting the effective sense resistance (Rs in parallel with Rs1) as Rs' and the monitored voltage at the mirror terminal as Vm', it can be shown that, for a large value of k and I1>>I2:

$$I=(k/Rs)\cdot Vm\cdot(((Rs/Rs')Vm'-Vm)/(Vm-Vm')) \quad (2).$$

Equation (2) can be implemented in a microprocessor or digital logic to determine the load current I from the monitored values Vm and Vm' and the known values of k, Rs, and Rs'. It can be appreciated that, with Rs' being very large so that Vm' becomes substantially equal to Vd, equation (2) reduces to the same form as equation (1) above.

Instead of producing a change of the voltage Vm at the mirror terminal M by changing the resistance of the sense resistor, the voltage Vm can be changed by changing the current passed by the sense resistor 16. For example, FIG. 4 illustrates a circuit in which a current source 36, powered from a positive supply voltage Vdd, is selectively turned on by the control signal C to supply an additional current i to the junction of the sense resistor 16 and the mirror terminal M of the power MOSFET 10.

It can be appreciated that, ideally with Rs=0, the true drain-source current, denoted I2t, through the MOSFET 14 that it is desired to measure is given by I2t=Vd/Rb, whereas a current I2m that is actually measured using the sense resistor 16 is given by I2m=Vd/(Rb+Rs), where as above Vd is the voltage at the drain terminal D of the power MOSFET 10 and Rb is the on resistance of the MOSFET 14. A correction factor F can be defined as:

$$F=I2t/I2m=(Vd/Rb)/(Vd/(Rb+Rs))=(Rb+Rs)/Rb.$$

In the circuit of FIG. 4, when the current source 36 is turned on by the control signal C, the voltage Vm at the mirror terminal M of the power MOSFET 10 increases by an amount ΔVm=i·Req, where Req is the equivalent resistance of the sense resistor 16 in parallel with the on-resistance Rb of the MOSFET 14, the drain voltage Vd being relatively small (e.g. ~100 mV) so that the drain is a virtual ground for the added current. Thus:

$$Req=Rb\cdot Rs/(Rb+Rs)=Rs/F$$

and $$\Delta Vm=i\cdot Rs/F.$$

If Vm is the voltage of the mirror terminal M measured using the sense resistor 16 with the current source 36 turned off, then:

$$F=I2t/I2m=I2t\cdot Rs/Vm$$

so that $$\Delta Vm=i\cdot Rs/(I2t\cdot Rs/Vm)=i\cdot Vm/I2t$$

and $$I2t=i\cdot Vm/\Delta Vm \quad (3).$$

From equation (3), the drain-source current I1 of the MOSFET 12 is determined by multiplying I2t by the current mirror ratio k of the power MOSFET 10, thereby accurately determining the total load current. It can be noted that this determination is not dependent upon the resistance Rs of the sense resistor 16. It is only necessary, for example using an ADC and microprocessor as described above, to measure the voltage Vm with the current source 36 turned off, to measure the change ΔVm in this mirror terminal voltage due to the current source 36 being turned on, and to calculate the load current from these measurements, the known constant current i, and the known ratio k of the power MOSFET 10.

In this case the multiplication factor i/ΔVm can be determined only once, occasionally, or continuously in view of temperature variations, as may be desired. As described above, an amplifier can optionally be provided to amplify the monitored voltage supplied to the ADC.

Instead of selectively supplying an additional current to the sense resistor 16 as described above with reference to FIG. 4, a current sink could alternatively be connected in parallel with the sense resistor 16 and controlled by the control signal C to selectively sink a constant amount of the drain-source current of the MOSFET 14, to provide a decrease in the monitored voltage and an equivalent result.

In each of these cases, the accuracy with which the load current is determined depends upon the accuracy of the current source or sink. An accurate current source 36 or current sink can for example be provided by mirroring a current determined by supplying a precise voltage to a fixed resistor.

Using the circuits of FIGS. 2 to 5, the load current is determined algebraically by a calculation based on monitoring of the respective voltages, e.g. the voltage Vm at the mirror terminal M of the power MOSFET 10. The algebraic calculation can be substantially simplified, to multiplication by a known constant, by providing a control arrangement that maintains the voltage Vm at the mirror terminal M to have a known ratio to the voltage Vd at the drain D of the power MOSFET.

Figure 6:
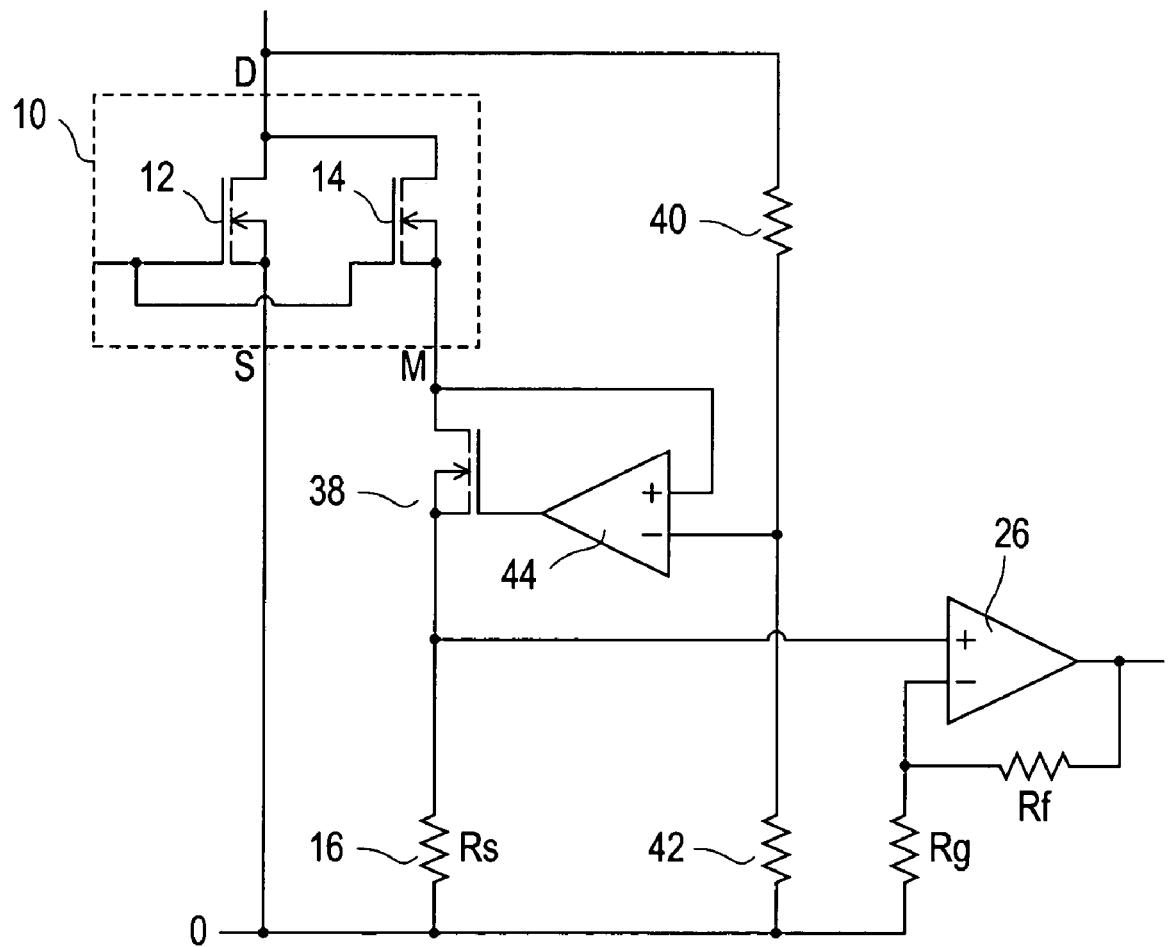
FIG. 6 schematically illustrates a current sensing circuit in accordance with another embodiment of the invention.

For example, FIG. 6 shows a circuit which varies the total resistance connected between the mirror terminal M and the zero-volt line so that the voltage Vm at the mirror terminal M is half the voltage Vd at the drain terminal D of the power MOSFET 10. Consequently, the calculation to determine the total load current is a doubling of the monitored voltage, which can be carried out very simply in an analog or digital manner. Although FIG. 6 relates to varying a resistance, it can be appreciated that other circuit arrangements can produce similar results by varying a current through a fixed resistance.

Referring to FIG. 6, the power MOSFET 10 has its source terminal S connected to the zero-volt line and its mirror terminal M connected to the zero-volt line via the drain-source path of a MOSFET 38 in series with the current sense resistor 16 having the resistance Rs. A voltage dropped across the resistor 16 is supplied to and amplified by an amplifier 26 having a similar form to that shown in FIG. 2, with a gain A.

A potential divider is constituted by two resistors 40 and 42 connected in series between the drain terminal D of the power MOSFET 10 and the zero-volt line. In this example, the resistors 40 and 42 have equal resistances, so that with the drain voltage Vd a voltage Vd/2 is produced at the tapping point of the potential divider and is supplied to an inverting input of an amplifier 44. The amplifier has a non-inverting input connected to the mirror terminal M, and an output connected to a gate of the MOSFET 38. Accordingly, the amplifier 44 operates to control the MOSFET 38, varying the drain-source resistance of the MOSFET 38, so that the mirror terminal M of the power MOSFET 10 is at the same potential Vd/2 as the tapping point of the potential divider.

Consequently, in the circuit of FIG. 6 the MOSFET 38 is controlled, in a manner that also compensates for temperature changes, so that:

$$Rm+Rs=Rb=k \cdot Ra$$

where Rm is the drain-source resistance of the MOSFET 38, Ra and Rb are the on-resistances of the MOSFETs 12 and 14 respectively, and k is the current mirror ratio of the power MOSFET 10. In consequence, the current that flows through the current sense resistor 16 is substantially I/(2 k) where I is the total load current of the power MOSFET 10, and the amplifier 26 produces an output voltage of I·Rs·A/(2 k). This monitored output voltage directly represents the total load current I of the power MOSFET 10, because Rs, A, and k are known constants.

The description above relates to normal steady-state operating conditions. Purely by way of example, under such conditions the resistances Ra and Rb may be of the order of 0.005 and 8 ohms respectively, k may be of the order of 150 to 1000, the drain voltage Vd may be of the order of 100 mV, the mirror terminal M may have a voltage of the order of 30 to 50 mV, and the resistance Rs may be of the order of 5 ohms (for example in FIG. 6) to 20 ohms (for example in FIG. 2). It can be appreciated, therefore, that the monitored voltages are quite small, and that an amplifier such as the amplifier 26 is preferably provided for supplying increased voltages to the ADC and/or other circuits.

It can also be appreciated that different conditions apply, for example, for inrush currents during charging of capacitances on initial application of power via the power MOSFET 10, and modifications of the circuits described above may be necessary to accommodate inrush current conditions.

For example, in the circuit of FIG. 6, for inrush current conditions the MOSFET 38 needs to be fully conductive, for which purpose it may also be driven by a signal (not shown) responsive to the inrush state. In the circuit of FIG. 6 an inrush current limit, also referred to as a short-circuit current limit, is substantially half the overload current limit described above with reference to FIG. 1; this can be changed by modifying the reference voltage Vref for the inrush state.

In the circuits of FIGS. 2 to 5, typically a digital calculation of the load current will be too slow for the result of this to be used for inrush or short circuit current limiting, as distinct from load current (and hence power) monitoring, and in these cases such current limiting functions can be provided by analog circuitry in known manner.

It will be appreciated that, in any of the circuits described above, the zero volt line can have any other desired potential, and that instead of being connected to the source terminal of the MOSFET 12 this can be connected to an additional connection (not shown) directly to the source of the MOSFET 12 and hence also to the source terminal S, for example as shown by a Kelvin connection in AND8093/D referred to above.

The power MOSFET 10 can be used in a variety of applications for which it may be desired to monitor or limit the load current as described above. In particular, for example, as described above it may be used for supplying a supply voltage to one or more power converters, or it may be used directly as a switching transistor within a power converter (switch mode power supply). Apart from the current monitoring and/or limiting circuits for example as described above, the power MOSFET 10 in such applications can be connected and controlled in known manner.

Although particular forms of circuit and calculations are described above by way of example, it can be appreciated that other circuits and calculations can be provided to produce similar results. Thus although particular embodiments of the invention are described above in detail, it can be appreciated that numerous modifications, variations, and adaptations may be made without departing from the scope of the invention as defined in the claims.

The invention claimed is:

1. A method of monitoring current of a MOSFET having gate, drain, source, and mirror terminals, the MOSFET comprising a main MOSFET coupled to the gate, drain, and source terminals and a current mirror MOSFET coupled to the gate, drain, and minor terminals, the method comprising the steps of:
    coupling a current sense resistance to the mirror terminal;
    monitoring a first voltage dependent upon current through the current sense resistance;
    determining a second voltage, different from the first voltage, of a terminal of the current mirror MOSFET; and
    determining current of the MOSFET in dependence upon the first and second voltages.

2. A method as claimed in claim 1 wherein the first and second voltages comprise monitored voltages of the minor and drain terminals respectively.

3. A method as claimed in claim 2 and comprising the step of monitoring the first and second voltages alternately.

4. A method as claimed in claim 1 wherein the step of determining the second voltage comprises changing the current sense resistance to produce the first and second voltages at the mirror terminal with different values of current sense resistance.

5. A method as claimed in claim 4 wherein the second voltage is produced by switching the mirror terminal to a substantially open circuit, whereby the second voltage at the mirror terminal is approximately equal to a voltage at the drain terminal.

6. A method as claimed in claim 1 wherein the step of determining the second voltage comprises switching current to or from the current sense resistance to produce the first and second voltages at the mirror terminal with different values of current through the current sense resistance.

7. A method as claimed in claim 1 wherein the current sense resistance is coupled to the mirror terminal via a controllable resistance, the first voltage is a voltage at a junction between the current sense resistance and the controllable resistance, and the second voltage is a voltage at the mirror terminal determined by a control circuit controlling the controllable resistance to maintain the second voltage as a constant fraction of a voltage at the drain terminal.

8. A method as claimed in claim 7 wherein the second voltage at the mirror terminal is determined by the control circuit to be half the voltage at the drain terminal.

9. A method as claimed in claim 1 and including the step of converting the first and second voltages to digital values, wherein the step of determining current of the MOSFET comprises determining the current digitally from the digital values.

10. A circuit arrangement for monitoring current of a MOSFET having gate, drain, source, and mirror terminals, the MOSFET comprising a main MOSFET coupled to the gate, drain, and source terminals and a current mirror MOSFET coupled to the gate, drain, and mirror terminals, comprising:
   a current sense resistance coupled between the mirror terminal and a connection to the source terminal;
   a monitoring circuit responsive to a first voltage dependent upon current through the current sense resistance;
   a circuit for determining a second voltage, different from the first voltage, of a terminal of the current mirror MOSFET; and
   a circuit arranged to determine current of the MOSFET in dependence upon the first and second voltages.

11. A circuit arrangement as claimed in claim 10 wherein the circuit arranged to determine current of the MOSFET comprises an ADC (analog-to-digital convener) responsive to at least the first voltage and digital logic responsive to an output of the ADC.

12. A circuit arrangement as claimed in claim 10 and including a selector for alternately selecting voltages of the mirror and drain terminals as the first and second voltages respectively.

13. A circuit arrangement as claimed in claim 10 and including a switch arranged to change the current sense resistance to produce the first and second voltages at the mirror terminal with different values of current sense resistance.

14. A circuit arrangement as claimed in claim 13 wherein the second voltage is produced in response to the switch switching the mirror terminal to a substantially open circuit, whereby the second voltage at the mirror terminal is approximately equal to a voltage at the drain terminal.

15. A circuit arrangement as claimed in claim 10 and including a switched current source or sink arranged to switch current to or from the current sense resistance to produce the first and second voltages at the mirror terminal with different values of current through the current sense resistance.

16. A circuit arrangement as claimed in claim 10 wherein the circuit for determining the second voltage comprises a controllable resistance, via which the current sense resistance is coupled to the mirror terminal, and a control circuit responsive to a voltage at the drain terminal to control the controllable resistance to maintain a voltage at the mirror terminal as a constant fraction of the voltage at the drain terminal, the first voltage being constituted by a voltage at a junction between the current sense resistance and the controllable resistance and the second voltage being constituted by the voltage at the mirror terminal.

17. A circuit arrangement as claimed in claim 16 wherein the control circuit comprises an amplifier having differential inputs coupled to the mirror terminal mid to a tapping point of a potential divider between the drain and source terminals.

18. A circuit arrangement as claimed in claim 16 wherein the circuit arranged to determine current of the MOSFET includes an amplifier for amplifying the first voltage.

19. A circuit arrangement as claimed in claim 10 wherein the circuit arranged to determine current of the MOSFET includes an amplifier for amplifying at least the first voltage.

* * * * *

UNITED STATES PATENT AND TRADEMARK OFFICE
CERTIFICATE OF CORRECTION

| | |
|---|---|
| PATENT NO. | : 7,365,559 B2 |
| APPLICATION NO. | : 11/119699 |
| DATED | : April 29, 2008 |
| INVENTOR(S) | : Roger Colbeck |

Page 1 of 1

It is certified that error appears in the above-identified patent and that said Letters Patent is hereby corrected as shown below:

Column 10, Claim 1, Line 27, "minor" should read -- mirror --.

Column 10, Claim 2, Line 38, "minor" should read -- mirror --.

Column 11, Claim 11, Line 23, "convener" should read -- converter --.

Column 12, Claim 17, Line 25, "mid" should read -- and --.

Signed and Sealed this

Ninth Day of September, 2008

JON W. DUDAS
*Director of the United States Patent and Trademark Office*